United States Patent [19]

Liu et al.

[11] Patent Number: 5,010,029

[45] Date of Patent: Apr. 23, 1991

[54] METHOD OF DETECTING THE WIDTH OF SPACERS AND LIGHTLY DOPED DRAIN REGIONS

[75] Inventors: Yow-Juang (Bill) Liu, San Jose; Zahra Hadjizadeh-Amini, Cupertino, both of Calif.

[73] Assignee: Advanced Micro Devices, Inc., Sunnyvale, Calif.

[21] Appl. No.: 313,984

[22] Filed: Feb. 22, 1989

[51] Int. Cl.$^5$ ............................................. H01L 21/66
[52] U.S. Cl. ............................................. 437/44; 437/8; 437/41
[58] Field of Search ............................ 437/8, 41, 44, 235, 437/238, 149, 153, 154, 30, 34, 57; 357/23.3, 23.9, 23.11, 91

[56] References Cited

U.S. PATENT DOCUMENTS

| | | | |
|---|---|---|---|
| 4,282,648 | 8/1981 | Yu et al. | 437/34 |
| 4,366,613 | 1/1983 | Ogura et al. | 437/30 |
| 4,419,809 | 12/1983 | Riseman et al. | 437/41 |
| 4,503,601 | 3/1985 | Chiao | 437/29 |
| 4,577,391 | 3/1986 | Hsia et al. | 437/36 |
| 4,709,467 | 12/1987 | Liu | 437/30 |

OTHER PUBLICATIONS

Tsang et al., "Fabrication of High-Performance LDD FETs with Oxide Sidewall-Spacer Technology", IEEE Trans. on Electron Devices, vol. ED-29, No. 4, Apr. 1982, pp. 590-596.
Bril et al., "Electrical Measurements of Sidewall Spacer Dimensions", Proc. SPIE Int. Soc. Opt. Eng., 1985, vol. 565, pp. 117-120.
Huang, "Using the Cross-Bridge Structure to Monitor the Effective Oxide Sidewall-Spacer Width in LDD Transistors", IEEE Electron Device Letters, vol. EDL-9, No. 5, May 1985, pp. 208-210.

Primary Examiner—Olik Chaudhuri
Assistant Examiner—M. Wilczewski
Attorney, Agent, or Firm—Fleisler, Dubb, Meyer & Lovejoy

[57] ABSTRACT

A process for fabricating field effect transistors with lightly doped drain (LDD) regions having a selected width includes a method of optically detecting the width of spacers used to mask the LDD regions during the source and drain implant and a method of electrically determining (confirming) the width of the LDD regions. In the optical method, reference structures are formed concurrently with the fabrication of the gates for FETs, a spacer material is formed on the substrate, the gates and the reference structures, the spacer material is etched away and the width of the spacers is optically detected by aligning the edges of spacers extending from two reference structures separated by a known distance. In the electrical method, the width is determined by defining a test area with known dimension, forming both N+ and N− regions in the test area, measuring the resistance across the test area, calculating the resistance of the N+ and N− regions, and calculating the width of the N− region from the resistance of the N− region.

11 Claims, 4 Drawing Sheets 5,010,029

METHOD OF DETECTING THE WIDTH OF SPACERS AND LIGHTLY DOPED DRAIN REGIONS

BACKGROUND OF THE INVENTION

1. Field of the Invention

The present invention generally relates to the fabrication of field effect transistor (FET) structures and particularly to the fabrication of field effect transistor structures with lightly-doped drain (LDD) regions. More specifically, the present invention relates to a method for monitoring the width of lightly-doped drain regions in the fabrication of lightly-doped drain field effect transistors.

2. Description of the Related Art

Lightly-doped drain (LDD) regions have commonly been used in reducing the length of the channel region in a FET, thereby reducing the size of transistors. The reduction in the length of the channel region is made possible by LDD regions which separate the drain and source regions from the channel region, and thus increase the channel breakdown voltage and reduce electron impact ionization (hot electron effects) by reducing the electric field at the source and drain pinch-off regions.

FETs having LDD regions are typically fabricated by first implanting regions at both ends of a gate with a light dose of an N-type dopant, thereby defining a channel between two $N^-$ regions. A spacer (or mask) is then formed over portions of the $N^-$ regions adjacent to the gate structures. Thereafter, a second implant is performed with a heavier dose of an N-type dopant to form $N^{30}$ source and drain regions. The spacer masks the underlying $N^-$ regions during the second implantation so that these regions become the LDD regions. Thus, the width of the spacers defines the width of the LDD regions.

While the channel breakdown voltage of a LDD FET and its ability to resist hot electron effects can be increased by increasing the width of the LDD regions, the LDD regions can increase the resistance of the transistor channel and degrade the current drive capability of the FET. Consequently, it is important to control the fabrication process so that an optimum LDD width is achieved.

To control the fabrication process, it is desirable to have a convenient method of monitoring the width of the spacers which mask the $N^-$ regions during the source and drain implant. Two methods are conventionally utilized:

The width of the insulators can be observed cross-sectionally With a scanning electron microscope (SEM). However, this technique, which involves a destructive cleaving of a sample Which is then viewed with a SEM, is slow, tedious and cannot be used inline in the fabrication process. The number of samples examined is relatively small because of the inconvenience and the destructive nature of the test. Moreover, the accuracy of this method is limited by the resolution of the SEM.

An electrical method for measuring the width of LDD insulators is described in "Using The Cross-Bridge Structure To Monitor The Effective Oxide Sidewall-Spacer Width in LDD Transistors," by T. Y. Huang, IEEE Electron Device Letters, Vol. EDL-6, No. 5, May 1985, pages 208-210. In this method, the insulator width is determined by measuring the resistance of a region created in a process-monitor wafer having a crossbridge test pattern. In order not to obscure the width information of the cross-bridge test pattern, the $N^-$ implant, which is normally required for LDD formation, is deliberately skipped in the process monitor wafer. Therefore, the method must be practiced on a separate test wafer and cannot be used in-line.

SUMMARY OF THE INVENTION

It is therefore, an object of the invention to provide a method of monitoring the width of LDD regions in a FET which can be integrated into the FET fabrication process.

A further object of the present invention is to provide a non-destructive method of monitoring the width of spacers used to mask LDD regions.

Another object of the present invention is to provide a method of optically monitoring the width of spacers used to mask LDD regions and electrically confirming the width of the resulting LDD regions.

A method, in accordance with the present invention, of fabricating, in a substrate, a field effect transistor having lightly-doped drain regions of a selected width, comprises the steps of: (a) forming reference structures separated by a known distance on the substrate and forming a gate structure on the substrate; (b) forming lightly-doped drain regions self-aligned with the ends of the gate structure in the substrate; (c) forming a layer of spacer material on the substrate, the reference structures and the gate structure; (d) etching the layer of spacer material to form spacers extending laterally from the ends of the gate structure and from the reference structures; (e) determining when the spacers have the selected width by detecting when the spacer extending from each reference structure has a width approximately equal to half of the distance between the reference structures; and (f) forming source and drain regions self-aligned with the spacers in selected portions of the lightly-doped drain regions.

The method of the present invention also includes electrically detecting the width of the spacers, by: (i) measuring the sheet resistance, $R_{sN-}$, of the substrate due to the first implant dosage, (ii) measuring the sheet resistance, $R_{sn+}$, of the substrate due to the combination of the first and second implant dosages, (iii) measuring the resistance, R, of the test region, and (iv) calculating the width of the spacers and thus the lightly-doped drain regions based upon the measured resistance values.

DESCRIPTION OF THE PREFERRED EMBODIMENTS

A process of fabricating N-channel field effect transistors with lightly-doped drain regions will be described to illustrate how the present invention can be used to optically monitor the width of spacers used to mask LDD regions during an implant which forms source and drain regions self-aligned with the spacers and to electrically confirm the width of the resulting lightly-doped drain regions.

In one embodiment of the invention, at least two reference structures separated by a known distance are formed on the substrate. Spacers extending from the reference structures are formed concurrently with the formation of spacers extending from the gate structures. The width of the spacers is monitored by optically determining when the spacers extending laterally from the reference structures are aligned. The width of each spacer is then equal to half the distance between the pair of reference structures. Preferably, several pairs of reference structures are formed with known, different distances between the reference structures of each pair. The width of the spacers is detected by locating a pair of reference structures for which the edges of the spacers are best aligned.

In another embodiment of the invention, two parallel reference structures are formed to define a substantially rectangular test region with known length and width between the reference structures. Undergoing the same or similar process steps as the field effect transistors, the test region is submitted to a first dopant implant to form $N^-$ regions self-aligned with the reference structures. Spacers are then formed to extend from the reference structures, and the test region is submitted to a second dopant implant to form and $N^+$ region between the two $N^-$ regions masked by the spacers. The width of the spacers is calculated from measurements of the sheet resistance of the substrate after the first dopant implant, the sheet resistance of the substrate after the second dopant implant, and the resistance across the test region.

Figure 1A:
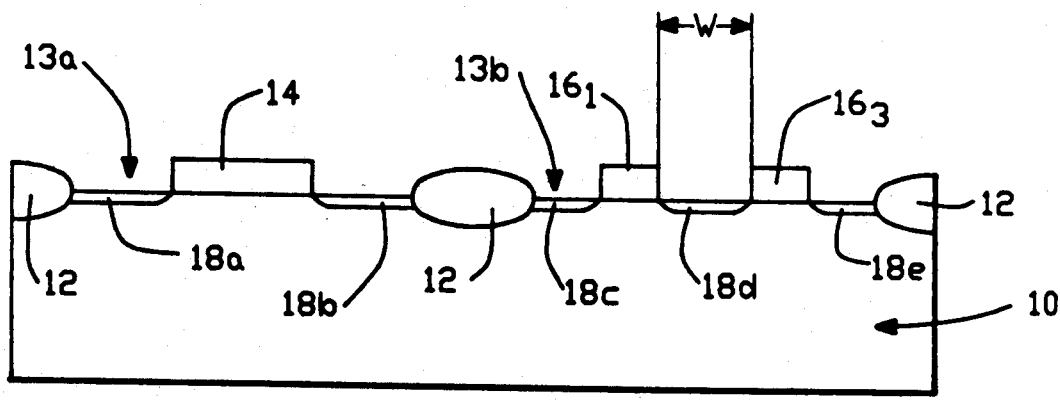
FIGS. 1A-1C are cross-sectional views of a FET having lightly-doped drain field effect transistors in various stages of fabrication in accordance with the method of the present invention.

These methods of monitoring and/or detecting the width of spacers and LDD regions formed utilizing the spacers during the fabrication of a FET will be described with reference to FIGS. 1-4. A substrate (a wafer) 10 doped with a background of P-type impurities (e.g., boron) is shown in FIG. 1A. Using conventional fabrication techniques, field oxide regions 12 are formed on the wafer to define active regions 13a, b. Using conventional fabrication techniques, a gate structure 14 is formed in active region 13a where a FET is to be provided. Reference structures $16_1$ and $16_3$ are formed in active region 13b. Reference structures $16_1$ and $16_3$ may be formed utilizing the same process steps utilized in the formation of the gate structure 14. Accordingly, the reference structures $16_1$, $16_3$ are formed concurrently with the formation of the gate structure 14. Alternatively, reference structures $16_1$, $16_3$ may be formed using another process that will mask the substrate 10 during subsequent ion implantation steps.

An N-type dopant is implanted to form lightly doped regions 18a-e. The implant dosage is selected so that lightly doped regions 18a-e have $N^-$ electrical characteristics. The N-type dopant used to implant lightly doped regions 18a-e may be, for example, phosphorous or antimony, and the implant dosage may be, for example, $1 \times 10^{13} cm^{-2}$. Portions of lightly doped regions 18a-e will become the LDD regions of the FET formed in active region 13a.

Figure 1B:
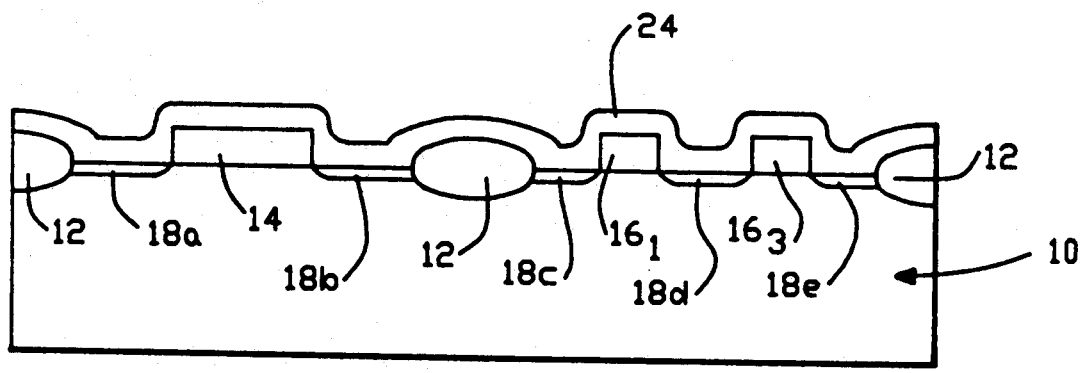
Figure 2A:
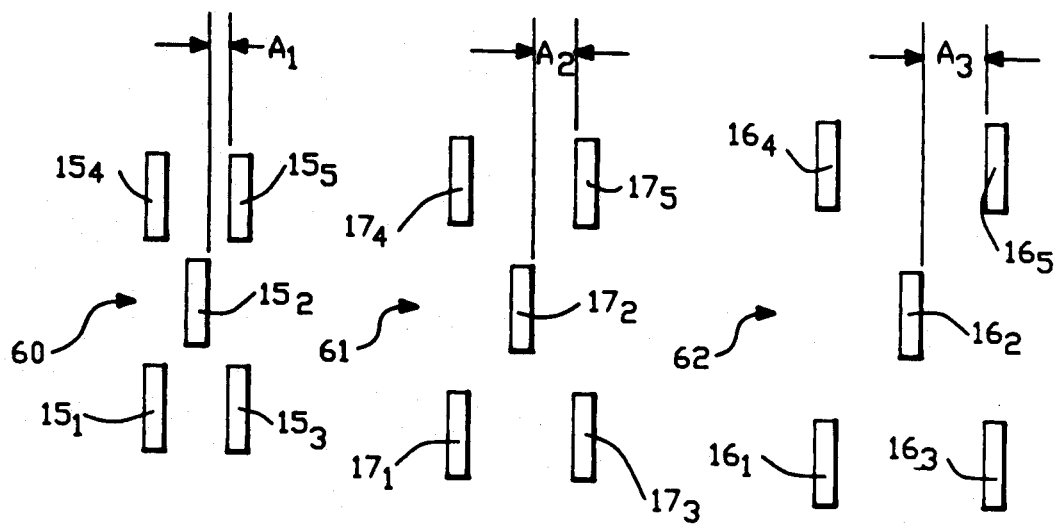
FIGS. 2A-B and 3A-B are plan views of different patterns of reference structures for use in the method of the present invention.
Figure 2B:
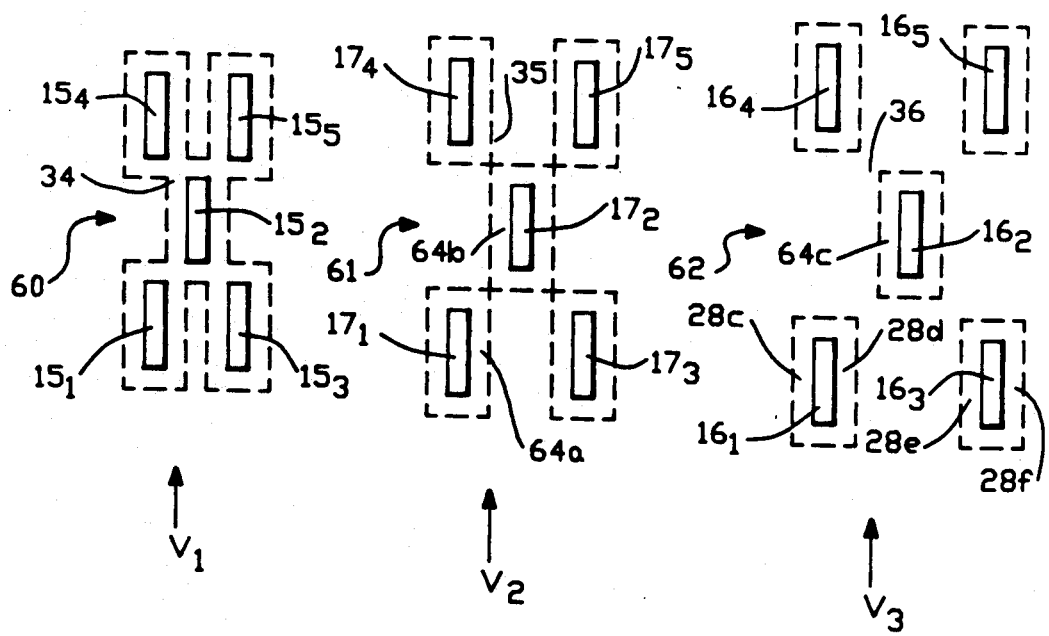

With reference to FIG. 1B, a layer of a spacer material 24 is formed over the exposed portions of substrate 10, field oxide regions 12, and over gate structure 14 and references structures $16_1$ and $16_3$. The spacer material layer 24 may be any material for which an etchant can be provided which removes the spacer material in a selectively controlled manner. Examples of the spacer material include oxides of silicon deposited using conventional chemical vapor deposition (CVD) techniques. Then, spacer material layer 24 is etched until only spacers 28a-f remain at the ends of gate structure 14 and at the edges of the reference structures $16_1$, $16_3$. Reactive ion etching (RIE) is one example of an etching process which may be used to etch spacer material layer 24. As shown in FIGS. 2A-B, reference structures $16_1$ and $16_3$ are preferably offset so that when viewed along the direction of arrows $V_1$-$V_3$ it is possible to determine when the spacers extending from the reference structures have aligned edges. The etching of spacer material layer 24 is stopped upon a determination that the spacers 28a-f have a desired width. FIGS. 2A and 2B illustrate three groups of reference structures 60-62. In FIG. 2B spacers 64a, b, extending from reference structures $17_1$, $17_2$, respectively, have aligned edges. Spacers 28d and 64c extending from reference structures $16_1$ and $16_3$ are examples of spacers having edges which are not aligned.

The use of reference structures, e.g., structures $16_1$ and $16_3$, to monitor and determine the width of spacers 28a-f will be described With reference to FIGS. 1-4. Lightly doped regions 18a-e are self-aligned with gate structure 14 and reference structure $16_1$, $16_2$. After the formation of spacers 28a-f, N-type dopant ions are implanted using gate structure 14, reference structures $16_1$, $16_3$, and spacers 28a-f as masks to form $N^+$ regions 30, 32, 40 in the portions of lightly doped regions 18a-e which are not masked by spacers 28a-f. The dosage for the second implant is approximately two orders of magnitude greater than the dosage used to implant lightly doped regions 18a-e, e.g., approximately $1 \times 10^{15} cm^{-2}$, and the N-type dopant may be, for example, arsenic. (The N-type dopants used in the first and second implants are selected to provide the resulting FET with selected characteristics; however, the particular N-type dopant selected is not related to or affected by the present invention.) The $N^+$ regions 30, 32 formed by the second implant are the source and drain regions, which are self aligned with spacers 28a and 28b, respectively for the FET. The portions of lightly doped regions 18a and b which are masked by spacers 28a, b become LDD regions 34 and 36. A channel region 38 is defined between LDD regions 34 and 36.

To provide in-line optical monitoring of the width of the spacers 28, several groups 60-62 of reference structures are fabricated on a portion of the substrate 10 (FIGS. 2A, B). However, for optical monitoring, reference structures 15-17 may be formed on a field oxide region or any other region since reference structures 15-17 do not have to be provided on the substrate. The edges of the reference structures in each group are separated by predetermined distances. Reference structures $15_1$-$15_5$ in group 60 have edges separated by a distance $A_1$, reference structures $17_1$-$17_5$ in group 61 have edges separated by a distance $A_2$, and reference structures $16_1$-$16_5$ in group 62 have edges separated by a distance $A_3$.

The difference in the values of distances $A_1$-$A_3$ is dependent upon the precision required in monitoring the width of the spacers. For example, the values of $A_1$-$A_3$ may increase in 0.1 micron increments. Clearly, more than three groups of reference structures may be provided to establish a greater range of distances or to provide smaller increments for the same range of distances.

Figure 3A:
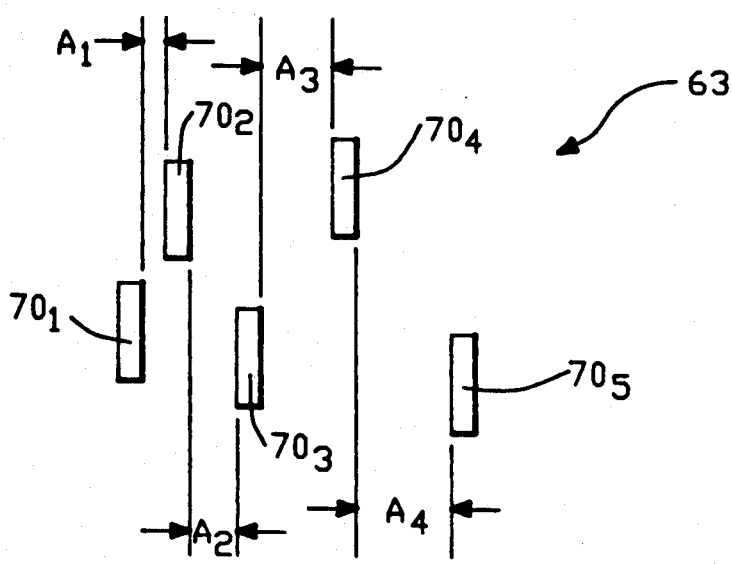
Figure 3B:
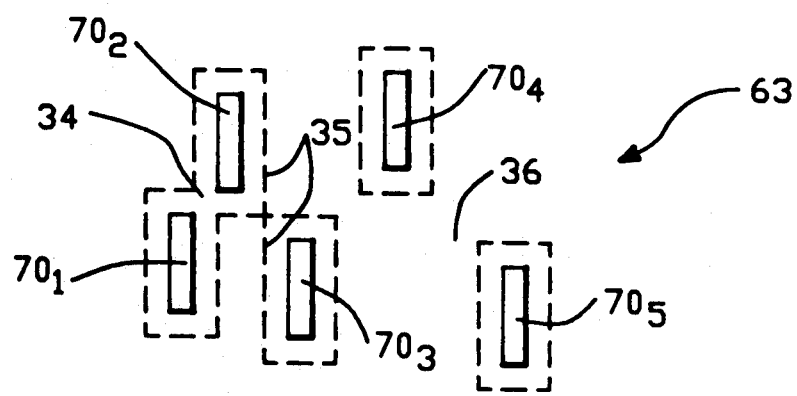

One pattern of spaces is illustrated in FIGS. 2A-B. Many alternate patterns of reference structures can be used to achieve the same purpose. One such alternate pattern is illustrated in FIGS. 3A-B in which the distance between reference structures $70_{1-5}$ of group 63 varies for each pair of reference structures. Reference structures $70_1$ and $70_2$ are separated by a distance $A_1$, reference structures $70_2$ and $70_3$ are separated by a distance $A_2$, reference structures $70_3$ and $70_4$ are separated by a distance $A_3$, and reference structures $70_4$ and $70_5$ are separated by a distance $A_4$.

Figure 1C:
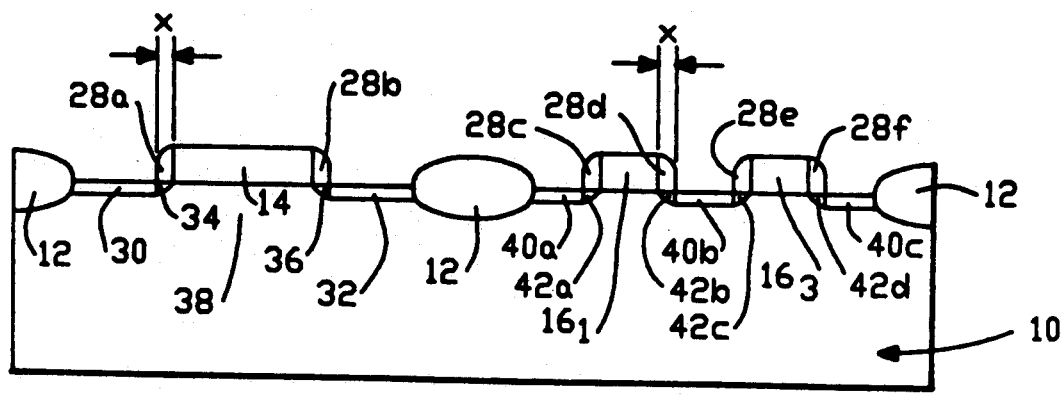

As the spacer layer 24 (FIG. 1B) is removed by etching, the portions of the spacer layer 24 at the edges of the gate 14 and the reference structures 15-17 remain, due to the increased thickness of these portions of the spacer layer 24, to form spacers 28, 64 extending laterally from the gate 14 and from the reference structures 15-17 (FIGS. 1C and 2B). The spacers extending from different groups of reference structures 60-62 will be aligned at different stages during the etching process. As shown in FIG. 2B, spacers 64a, b extending from reference structures $17_1$, $17_2$ are aligned when viewed along arrow $V_2$, thus, the width of each spacer is equal to $A_w/2$ (one-half of the distance between the spacers). If the spacers extending from reference structures $16_1$ and $16_2$ were aligned, each spacer would have a width equal to $A_3/2$. Note that the drawn distances $A_{1-3}$ should be compared with the actual distances between the reference structures as determined by measurements of the reference structures, e.g., optical measurements.

Figure 4A:
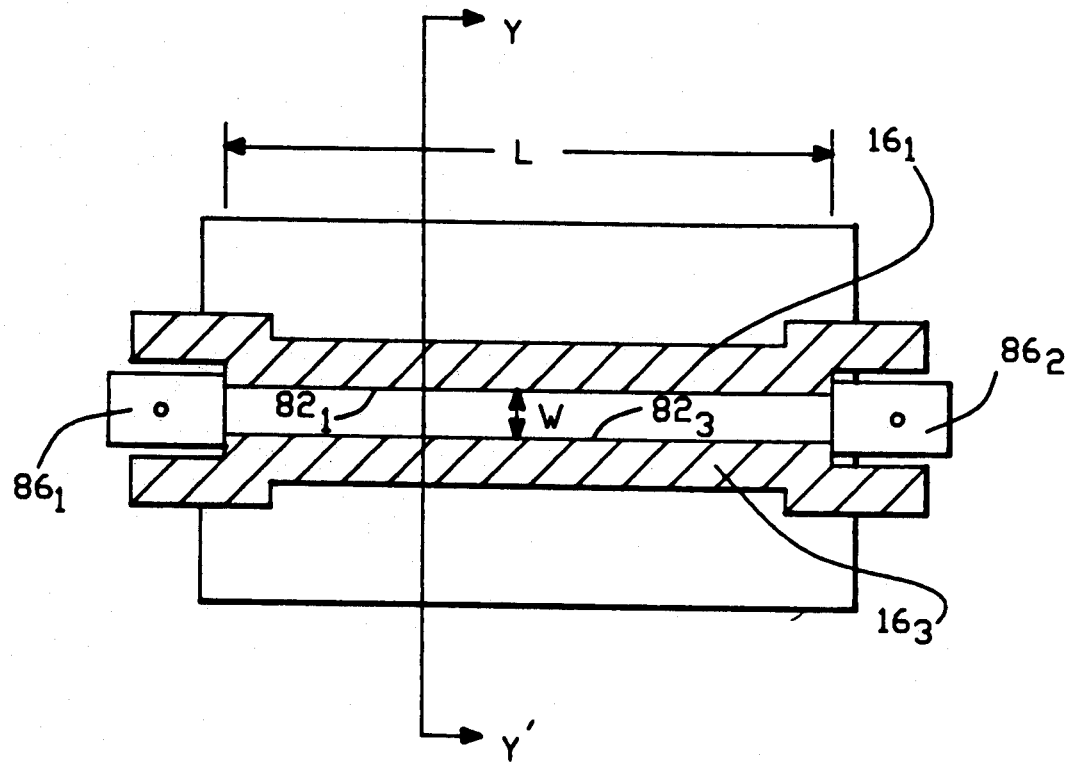
FIG. 4A is a plan view of a structure utilized in an electrical measurement to determine the width of spacers used to mask lightly-doped drain regions.
Figure 4B:
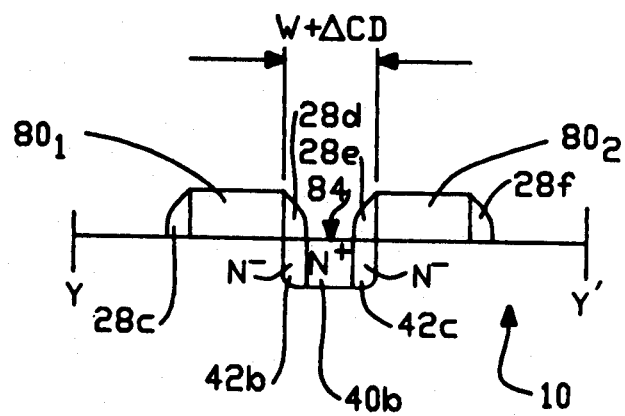
FIG. 4B is a cross-sectional view of the structures of FIG. 4A along line Y—Y'.

Electrical measurement for determining the width of the LDD regions are performed as follows. Two reference structures $16_1$, $16_3$, as illustrated in FIG. 4A, are formed on substrate 10. Reference structures $16_1$, $16_3$ have substantially parallel edges $82_1$, $82_3$ which define a rectangular test region 84 of known dimensions (length L and width W).

After reference structures $16_1$ and $16_3$ are formed, the first implant to form $N^-$ regions, as described above, provides an $N^-$ region 18d (FIG. 1B) in the entire test region 84. The first implant is also used to create a separate $N^-$ region (not shown) having known dimensions for control purposes. Spacers 28d, e are then fabricated and the second implant creates $N^+$ region 40b self-aligned with spacers 28d, e and having a width W-2X, where X is the width of each of spacers 28d, e. The second implant is also used to provide a separate $N^+$ control region (not shown) having known dimensions.

Contacts $86_{1-2}$ are formed at opposite ends of test region 84, and electrical resistance measurements are performed to detect the resistance R of test region 84. This resistance R is overall resistance of parallel resistances $R_{N-}$ of the $N^-$ regions 42b, c and $R_{N+}$ of $N^+$ region 40b. Thus, the resistance R can be expressed as follows:

$$R = [(R_N-)(R_N+)]/[(R_N-(R_N+)]  \qquad (1)$$

The width of each spacer 28d, e is X. Thus, $N^+$ region 40b has a width W-2X and the resistance $R_{N+}$ of $N^+$ region 40b is:

$$R_{N+} = (R_{sN+}) [L/(W + \Delta CD - 2X)]  \qquad (2)$$

where $\Delta CD$ is the difference between the drawn (intended) and actual widths of test region 84 and $R_{sN+}$ is the sheet resistance of the $N^+$ region as determined using the $N^+$ control region. Similarly $R_{sN-}$ is the sheet resistance of the $N^-$ regions.

The combined resistance $R_{N-}$ of the two $N^-$ regions is $$R_{N-} = (R_{sN-})(L/2X)  \qquad (3)$$

The value of $\Delta CD$ can be found by measuring the resistance $R_1$ of a wide test area having width $W_1$ and length $L_1$, and the resistance $R_2$ of a narrow test area having width $W_2$ and length $L_2$. The sheet resistance $R_s$ of the structure is $R_s = R_1(W_1/L_1)$, and the value of $\Delta CD$ is: $\Delta CD = (R_s)(L_2/R_2) - W_2$ In general, the values of $\Delta CD$, $R_{sN-}$ and $R_{sN+}$ are available at the time of process evaluation and extra steps are not required to obtain these values.

From equations 1, 2, and 3, the resistance R is:

$$R = \frac{[L(R_{sN+})(R_{sN-})]}{\{WX[(R_{sN+}) - (R_{sN-})] + [(W + \Delta CD)(R_{sN-})]\}}  \qquad (4)$$

Rearranging the equation (4), to solve for the width X of the spacers yields the following result:

$$X = \qquad (5)$$
$$\frac{1}{2} \frac{(R_{sN-})}{(R_{sN+}) - (R_{sN-})} \left\{ \left[ \frac{L(R_{sN+})}{R} \right] - (W + \Delta CD) \right\}$$

The width X of spacers 28, 64 can be measured by either the optical method or the electrical method. Comparing the results obtained by the optical and electrical methods may yield small differences caused by the effects of the diffusion of the $N^-$ regions on the electrical measurements. Further, these methods can be used in combination. Both methods can be implemented without substantially altering the steps of a conventional fabrication process and without destroying the tested wafer. Moreover, the optical method can be performed in-line so that the width of the spacers can be adjusted for the wafer undergoing fabrication.

Many modifications and variations of the present invention are possible and contemplated in light of the above teachings. These modifications may include changes in the specific conductivity type of the substrate and regions formed therein, the specific impurities and concentration used, the material used for the gate and reference structures and specific fabrication techniques. Accordingly, the following claims are intended to cover all modifications and equivalents falling within the scope of the invention.

What is claimed is:

1. A process of fabricating, in a substrate, a field effect transistor having lightly-doped drain regions of a selected width, comprises the steps of:

(a) forming reference structures, separated by a known distance, overlying the substrate and forming a gate structure overlying the substrate;

(b) forming lightly-doped drain regions self-aligned with the ends of the gate structure in the substrate;

(c) forming a layer of spacer material overlying the substrate, the reference structures and the gate structure;

(d) etching the layer of spacer material to form spacers extending laterally from the ends of the gate structure and from the reference structures;

(e) determining when the spacers have the selected width by detecting when the spacer extending from each reference structure has a width approximately equal to approximately one-half of the distance between the reference structures; and (f) forming source and drain regions self-aligned with the spacers in selected portions of the lightly-doped drain regions.

2. A method according to claim 1, wherein:

said step (a) comprises forming plural pairs of reference structures on the substrate, each pair of reference structures being separated by respective known distances; and said step (e) comprises determining the width of the spacers by optically detecting the separation between the spacers extending from the reference structures.

3. A method according to claim 2, wherein:

said step (a) comprises forming each pair of reference structures with laterally offset, substantially parallel edges; and said step (e) comprises sighting along a line parallel to the edges of the reference structures and centered between the edges of the reference structures and determining when the spacers extend to the sighting line.

4. A method according to claim 2, wherein said step (e) comprises determining the width of the spacers by locating a pair of reference structures having respective spacers whose edges are best aligned.

5. A method according to claim 1, wherein:

said step (a) comprises forming plural groups of reference structures on the substrate, the reference structures in each group of reference structures having laterally offset, substantially parallel edges, the planes of the parallel edges of the reference structures in each group of reference structures being separated by respective known distances; and said step (e) comprises sighting along a line parallel to the edges of the reference structures and centered between the edges of at least two reference structures in each group and determining the group of reference structures for which the spacers are best aligned.

6. A process of fabricating a semiconductor device in a substrate, including forming a first structure extending a selected distance from a second structure, comprising the steps of:

(a) providing a pair of reference structures separated by a distance approximately twice the selected distance overlying the substrate;

(b) providing a layer of material overlying the substrate, the reference structures, and the second structure;

(c) etching the layer of material provided in said step (b) to form the first structure and to form structures extending from the reference structures;

(d) determining when the first structure extends the selected distance by detecting when the structures extending from each reference structure has a width approximately equal to approximately one-half of the distance between the reference structures; and (e) stopping the etching based on the determination in said step (d).

7. A method according to claim 6, wherein:

said step (a) comprises forming plural pairs of reference structures on the substrate, each pair of reference structures being separated by respective known distances; and said step (d) comprises determining when the first structure extends the selected distance by optically detecting the separation between the structures extending from the reference structures.

8. A method according to claim 7, wherein:

said step (a) comprises forming each pair of reference structures with laterally offset, substantially parallel edges; and said step (d) comprises sighting along a line parallel to the edges of the reference structures and centered between the edges of the reference structures and determining when the structures extending from the reference structures extend to the sighting line.

9. A method according to claim 7, wherein said step (d) comprises determining the width of the first structure by locating a pair of reference structures having respective structures extending therefrom the edges of which structures are best aligned.

10. A process of fabricating, in a substrate, a field effect transistor having lightly-doped drain regions of a selected width, comprising the steps of:

(a) providing plural pairs of reference structures overlying the substrate, each pair of reference structures being separated by respective known distances;

(b) providing a gate structure overlying the substrate;

(c) forming lightly-doped drain regions in the substrate, the lightly-doped drain regions being self-aligned with the ends of the gate structure;

(d) forming a layer of spacer material overlying the substrate, the reference structures and the gate structure;

(e) etching the layer of spacer material to form spacers extending laterally from the ends of the gate structure and from the reference structures;

(f) determining the width of the spacers by locating a pair of reference structures having spacers extending therefrom the edges of which spacers are best aligned; and (g) forming source and drain regions self-aligned with the spacers in selected portions of the lightly-doped drain regions.

11. A method according to claim 10, wherein:

said step (a) comprises providing a preferred pair of reference structures separated by a distance twice the selected width; and said step (f) comprises determining when the spacers have the selected width by detecting when the spacer extending from each reference structure of the preferred pair of reference structures has a width approximately equal to approximately one-half of the distance between the preferred pair of reference structures.

* * * * *